(12) United States Patent
Chou

(10) Patent No.: US 10,276,692 B1
(45) Date of Patent: Apr. 30, 2019

(54) FIN DIODE STRUCTURE AND METHODS THEREOF

(71) Applicant: Taiwan Semiconductor Manufacturing Co., Ltd., Hsinchu (TW)

(72) Inventor: You-Hua Chou, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/885,114

(22) Filed: Jan. 31, 2018

Related U.S. Application Data

(60) Provisional application No. 62/592,821, filed on Nov. 30, 2017.

(51) Int. Cl.
| | |
|---|---|
| *H01L 29/76* | (2006.01) |
| *H01L 29/66* | (2006.01) |
| *H01L 29/78* | (2006.01) |
| *H01L 21/225* | (2006.01) |
| *H01L 27/12* | (2006.01) |
| *H01L 27/092* | (2006.01) |
| *H01L 21/02* | (2006.01) |
| *H01L 21/223* | (2006.01) |

(52) U.S. Cl.
CPC .. *H01L 29/66803* (2013.01); *H01L 21/02532* (2013.01); *H01L 21/2236* (2013.01); *H01L 21/2254* (2013.01); *H01L 27/0924* (2013.01); *H01L 27/1211* (2013.01); *H01L 29/6659* (2013.01); *H01L 29/66545* (2013.01); *H01L 29/66636* (2013.01); *H01L 29/785* (2013.01); *H01L 29/7835* (2013.01)

(58) Field of Classification Search
CPC ......... H01L 29/66636; H01L 21/02532; H01L 29/66575; H01L 29/66833; H01L 21/2254; H01L 29/66803; H01L 29/66969; H01L 29/7839; H01L 29/786; H01L 29/808
USPC ........................................................ 257/346
See application file for complete search history.

(56) References Cited

U.S. PATENT DOCUMENTS

| | | | |
|---|---|---|---|
| 8,703,593 | B2 | 4/2014 | Tsai et al. |
| 8,785,286 | B2 | 7/2014 | Tsai et al. |
| 8,853,025 | B2 | 10/2014 | Zhang et al. |

(Continued)

FOREIGN PATENT DOCUMENTS

| | | |
|---|---|---|
| DE | 102016113819 | 5/2017 |
| WO | WO2017052601 | 3/2017 |
| WO | WO2017078676 | 5/2017 |

*Primary Examiner* — Theresa T Doan
(74) *Attorney, Agent, or Firm* — Haynes and Boone, LLP

(57) ABSTRACT

A method and structure for forming a fin bottom diode includes providing a substrate having a plurality of fins extending therefrom. Each of the plurality of fins includes a substrate portion and an epitaxial layer portion over the substrate portion. A first dopant layer is formed on sidewalls of a first region of the substrate portion of each of the plurality of fins. After forming the first dopant layer, a first annealing process is performed to form a first diode region within the first region of the substrate portion. A second dopant layer is formed on sidewalls of a second region of the substrate portion of each of the plurality of fins. After forming the second dopant layer, a second annealing process is performed to form a second diode region within the second region of the substrate portion of each of the plurality of fins.

20 Claims, 14 Drawing Sheets

(56) References Cited

U.S. PATENT DOCUMENTS

| | | |
|---|---|---|
| 8,987,823 B2 | 3/2015 | Cheng et al. |
| 9,029,226 B2 | 5/2015 | Tsai et al. |
| 9,093,514 B2 | 7/2015 | Tsai et al. |
| 9,147,753 B2 | 9/2015 | Colinge et al. |
| 9,362,404 B2 | 6/2016 | Chen et al. |
| 9,406,546 B2 | 8/2016 | Tsai et al. |
| 9,425,317 B1 | 8/2016 | Wen et al. |
| 9,478,659 B2 | 10/2016 | Chen et al. |
| 9,583,342 B2 | 2/2017 | Tsai et al. |
| 9,583,490 B2 | 2/2017 | Peng et al. |
| 9,659,776 B2 | 5/2017 | Chen et al. |
| 9,716,086 B1 | 7/2017 | Cheng et al. |
| 9,847,388 B2 | 12/2017 | Cheng et al. |
| 1,009,030 A1 | 10/2018 | Jan et al. |
| 2013/0043536 A1* | 2/2013 | Rahim ............ H01L 29/66795 257/347 |
| 2013/0102137 A1* | 4/2013 | Jeng ................ H01L 21/2255 438/548 |
| 2016/0211262 A1 | 7/2016 | Jan et al. |
| 2016/0211264 A1 | 7/2016 | Peng et al. |
| 2017/0062557 A1 | 3/2017 | Cheng et al. |
| 2018/0247939 A1 | 8/2018 | Glass et al. |

\* cited by examiner

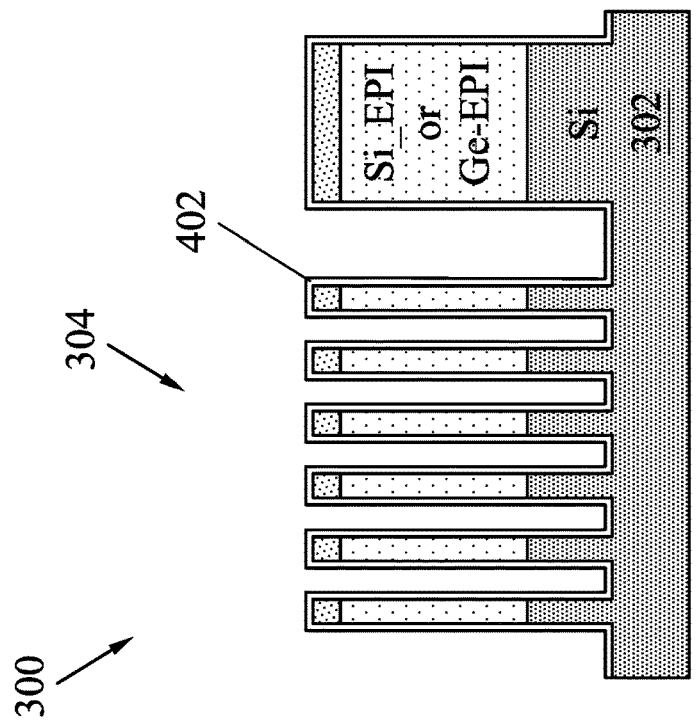
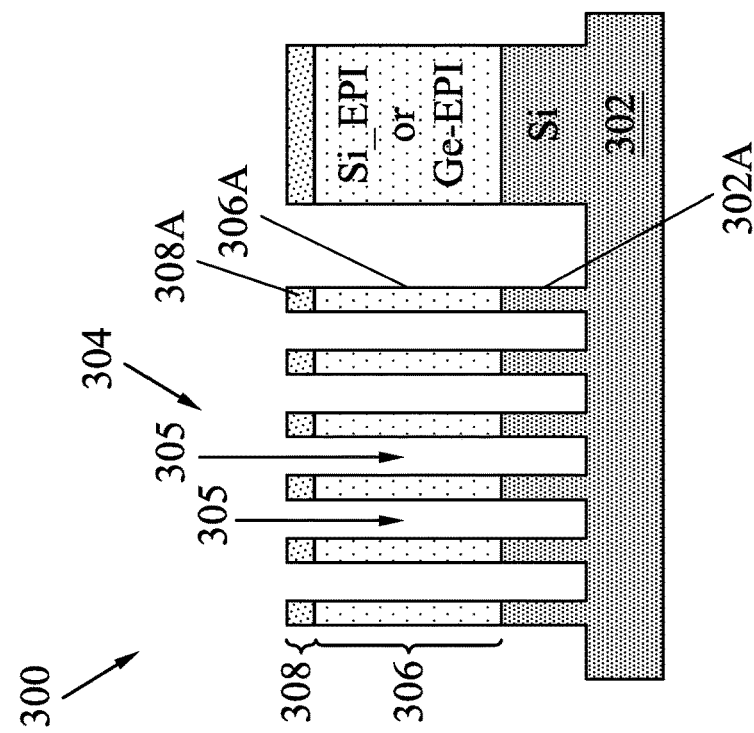

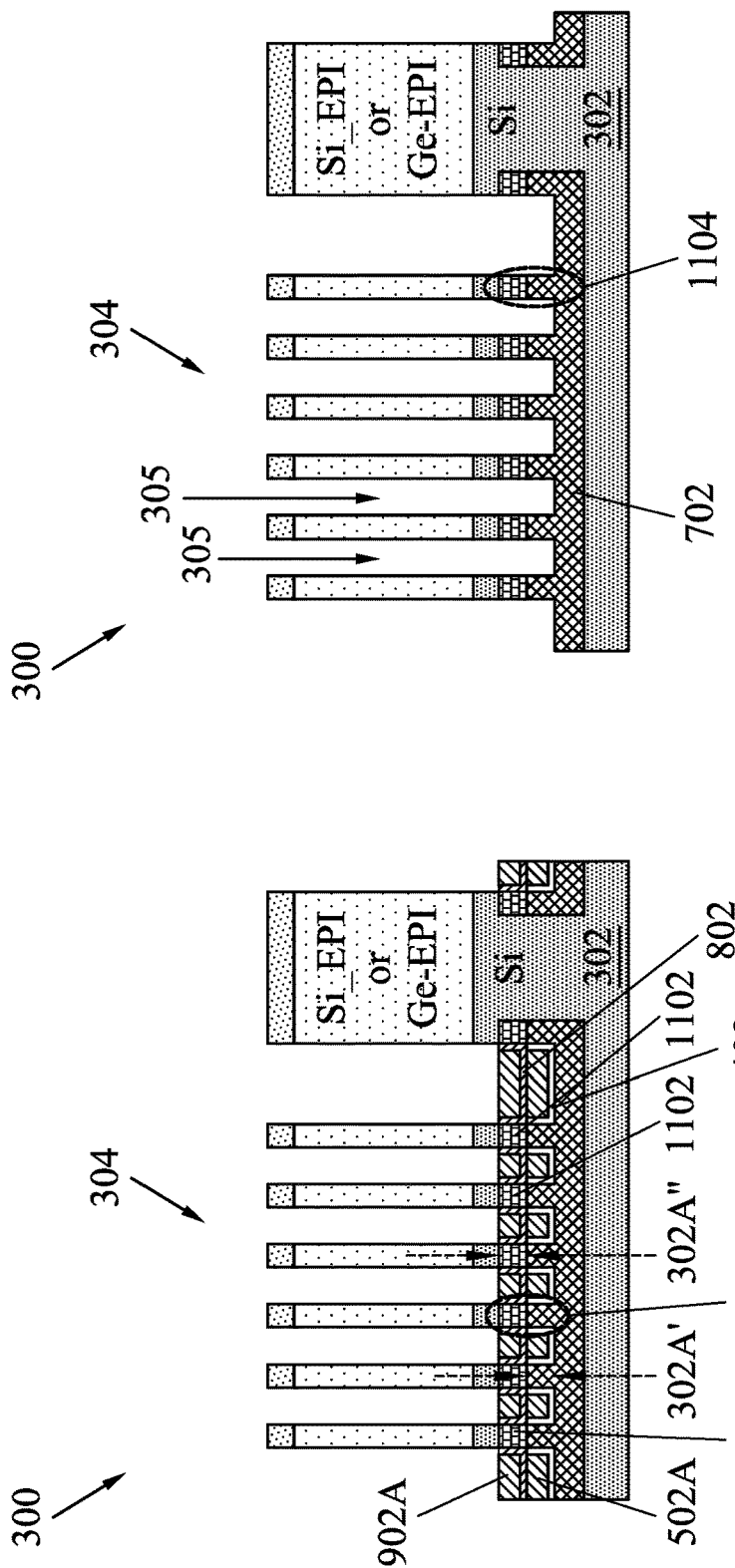

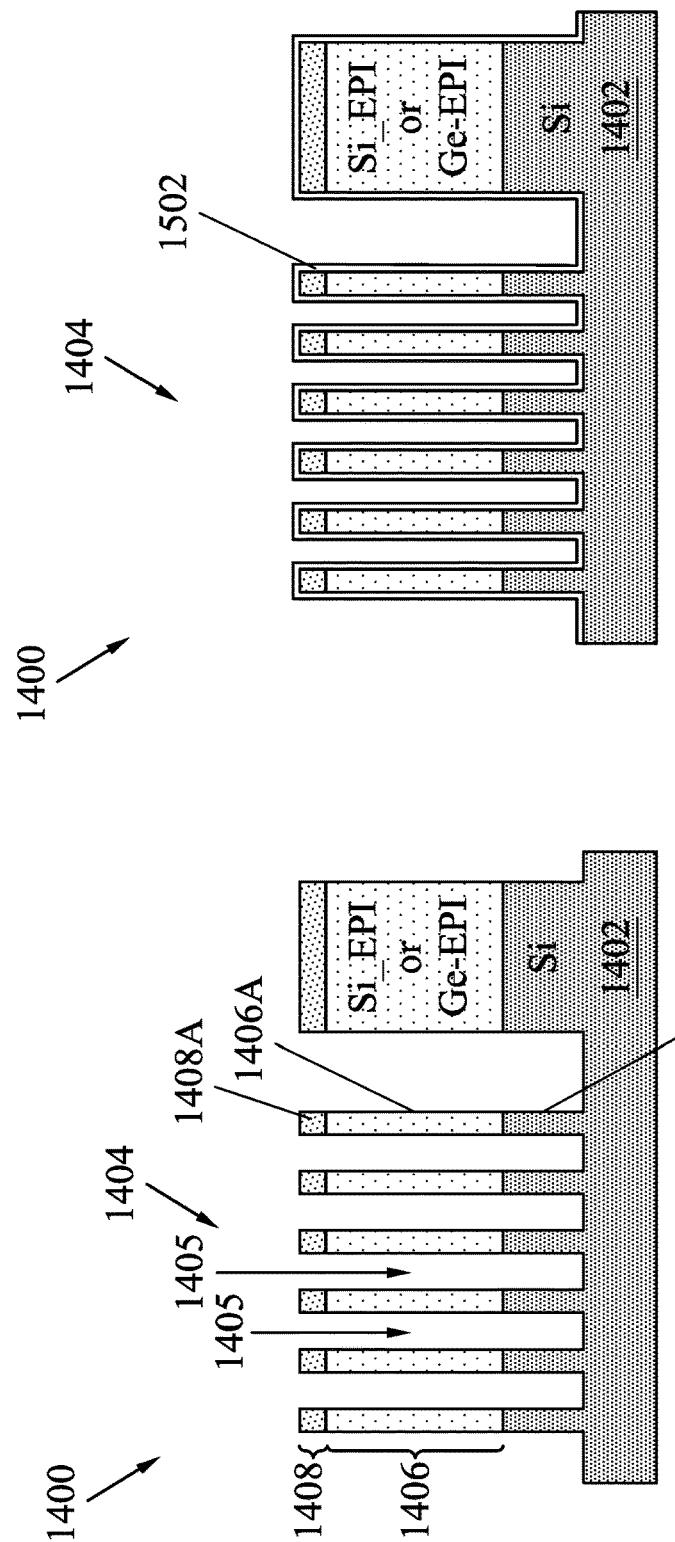

FIN DIODE STRUCTURE AND METHODS THEREOF

CROSS-REFERENCE TO RELATED APPLICATION

This application claims the benefit of U.S. Provisional Application No. 62/592,821, filed Nov. 30, 2017, the entirety of which is incorporated by reference herein.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. Unfortunately, aggressively scaled FinFETs may also suffer from excessive leakage current, in some cases, near the bottom of the fin-like structure. In an effort to mitigate such leakage current, ion implantation processes may be performed to create a P-N diode near the bottom of the fin-like structure of a FinFET device. However, ion plantation processes can directly contribute to the formation of defects, the introduction of impurities, and can impact a wider substrate area than is desired. As a result, FinFET device performance may be adversely affected.

Thus, existing techniques have not proved entirely satisfactory in all respects.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

FIGS. 3-12 provide cross-sectional views of a device at intermediate stages of fabrication and processed in accordance with the method of FIG. 2;

FIGS. 14-25 provide cross-sectional views of a device at intermediate stages of fabrication and processed in accordance with the method of FIG. 13.

DETAILED DESCRIPTION

Figure 1:
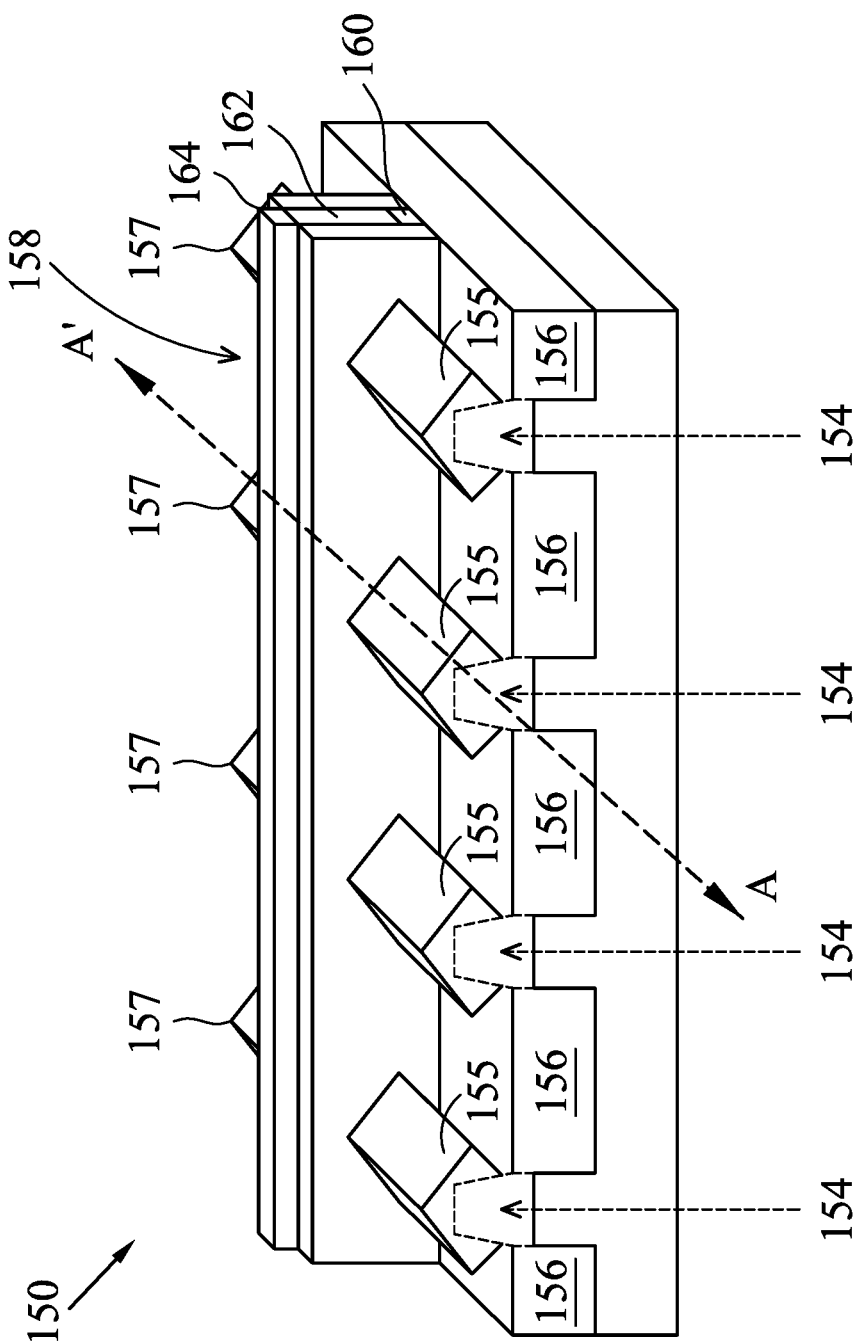
FIG. 1 is perspective view of an embodiment of a FinFET device according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other examples of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

Referring to FIG. 1, illustrated therein is a FinFET device 150, according to some embodiments. By way of example, the FinFET device 150 includes one or more fin-based, multi-gate field-effect transistors (FETs). The FinFET device 150 includes a substrate 152, at least one fin element 154 extending from the substrate 152, isolation regions 156, and a gate structure 158 disposed on and around the fin-element 154. The substrate 152 may be a semiconductor substrate such as a silicon substrate. The substrate 152 may include various layers, including conductive or insulating layers formed on the substrate 152. The substrate 152 may include various doping configurations depending on design requirements as is known in the art. The substrate 152 may also include other semiconductors such as germanium, silicon carbide (SiC), silicon germanium (SiGe), or diamond. Alternatively, the substrate 152 may include a compound semiconductor and/or an alloy semiconductor. Further, in some embodiments, the substrate 152 may include an epitaxial layer (epi-layer), the substrate 152 may be strained for performance enhancement, the substrate 152 may include a silicon-on-insulator (SOI) structure, and/or the substrate 152 may have other suitable enhancement features.

The fin-element 154, like the substrate 152, may include one or more epitaxially-grown layers, and may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 154 may be fabricated using suitable processes including photolithography and etching processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate while an etch process forms recesses into the silicon layer, thereby leaving an extending fin 154. The recesses may be etched using a dry etch (e.g., chemical oxide removal), a wet etch, and/or other suitable processes. Numerous other embodiments of methods to form the fins 154 on the substrate 152 may also be used.

Each of the plurality of fins 154 also include a source region 155 and a drain region 157 where the source/drain regions 155, 157 are formed in, on, and/or surrounding the fin 154. The source/drain regions 155, 157 may be epitaxially grown over the fins 154. In addition, a channel region of a transistor is disposed within the fin 154, underlying the gate structure 158, along a plane substantially parallel to a plane defined by section AA' of FIG. 1B. In some examples, the FinFET channel region includes silicon (Si) and/or a high-mobility material such as germanium, which may be epitaxially grown, as well as any of the plurality of compound semiconductors or alloy semiconductors as known in the art. High-mobility materials include those materials with electron and/or hole mobility greater than silicon (Si), which has an intrinsic electron mobility at room temperature (300 K) of around 1350 $cm^2/V$-s and an intrinsic hole mobility at room temperature (300 K) of around 480 $cm^2/V$-s.

The isolation regions 156 may be shallow trench isolation (STI) features. Alternatively, a field oxide, a LOCOS feature, and/or other suitable isolation features may be implemented on and/or within the substrate 152. The isolation regions 156 may be composed of silicon oxide, silicon nitride, silicon oxynitride, fluorine-doped silicate glass (FSG), a low-k dielectric, combinations thereof, and/or other suitable material known in the art. In an embodiment, the isolation regions 156 are STI features and are formed by etching trenches in the substrate 152. The trenches may then be filled with isolating material, followed by a chemical mechanical polishing (CMP) process. However, other embodiments are possible. In some embodiments, the isolation regions 156 may include a multi-layer structure, for example, having one or more liner layers.

The gate structure 158 includes a gate stack having an interfacial layer 160 formed over the channel region of the fin 154, a gate dielectric layer 162 formed over the interfacial layer 160, and a metal layer 164 formed over the gate dielectric layer 162. In some embodiments, the interfacial layer 160 may include a silicon oxide layer ($SiO_2$) or a silicon oxynitride (SiON) layer, where such interfacial layer may be formed by chemical oxidation, thermal oxidation, atomic layer deposition (ALD), chemical vapor deposition (CVD), and/or other suitable method. In some examples, the gate dielectric layer 162 includes a high-k dielectric layer such as hafnium oxide ($HfO_2$). Alternatively, the high-k dielectric layer may include other high-k dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. High-K gate dielectrics, as used and described herein, include dielectric materials having a high dielectric constant, for example, greater than that of thermal silicon oxide (~3.9). In still other embodiments, the gate dielectric layer 162 may include silicon dioxide or other suitable dielectric. The gate dielectric layer 162 may be formed by ALD, physical vapor deposition (PVD), CVD, oxidation, and/or other suitable methods. In some embodiments, the metal layer 164 may be deposited as part of a gate first or gate last (e.g., replacement gate) process. In various embodiments, the metal layer 164 includes a conductive layer such as W, Ti, TiN, TiAl, TiAlN, Ta, TaN, WN, Re, Ir, Ru, Mo, Al, Cu, Co, CoSi, Ni, NiSi, combinations thereof, and/or other suitable compositions. In some examples, the metal layer 164 may include a first metal material for an N-type transistor and a second metal material for a P-type transistor. Thus, the FinFET device 150 may include a dual work-function metal gate configuration. For example, the first metal material (e.g., for N-type devices) may include metals having a work function substantially aligned with a work function of the substrate conduction band, or at least substantially aligned with a work function of the conduction band of a channel region of the device 150. Similarly, the second metal material (e.g., for P-type devices) may include metals having a work function substantially aligned with a work function of the substrate valence band, or at least substantially aligned with a work function of the valence band of the channel region of the device 150. Thus, the metal layer 164 may provide a gate electrode for the device 150, including both N-type and P-type devices. In some embodiments, the metal layer 164 may alternately or additionally include a polysilicon layer. In various examples, the metal layer 164 may be formed using PVD, CVD, electron beam (e-beam) evaporation, and/or other suitable process. In some embodiments, sidewall spacers are formed on sidewalls of the gate structure 158. The sidewall spacers may include a dielectric material such as silicon oxide, silicon nitride, silicon carbide, silicon oxynitride, or combinations thereof.

In various instances, aggressively scaled FinFETs may suffer from excessive leakage current, in some cases, near the bottom of the fin-like structure. In some examples, electrostatic control of leakage current near the bottom of a fin structure is challenging because the bottom of the fin structure may be a weak spot for an applied electric field. Such an electric field weak spot may become even worse for fin structures that taper, for example, from a narrower width at a top of the fin structure to a wider width at the bottom of the fin structure. In an effort to mitigate such leakage current, and in at least some current methods, ion implantation processes may be performed to create a P-N diode near the bottom of the fin-like structure of a FinFET device. In operation, and in some cases, the P-N diode may be reversebiased, thus reducing leakage current at the bottom of the fin structure. However, formation of such a P-N diode using ion plantation processes can directly contribute to the formation of defects, the introduction of impurities, and can impact a wider substrate area than is desired. As a result, FinFET device performance may be adversely affected. Thus, existing methods have not been entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods of forming a diode for a multi-gate device (e.g., FinFET device) and related structures. In at least some embodiments, a diode structure is formed at the bottom of an individual fin structure to effectively lower leakage current for the FinFET device fabricated using the individual fin structure. In some examples, the diode structures disclosed herein may be referred to as a "fin bottom diode" or a "fin bottom P-N diode". In addition, and in contrast to some existing processes, the fin bottom diodes disclosed herein may be formed without the use of ion implantation processes (e.g., a Si substrate pre-implant process), thereby avoiding the problems associated with ion implantation processes. In various examples, the fin bottom diodes disclosed herein may also be designed and/or adjusted as needed for each fin of a plurality of fins disposed on a substrate. Additional details of embodiments of the present disclosure are provided below, and additional benefits and/or other advantages will become apparent to those skilled in the art having benefit of the present disclosure.

Figure 2:
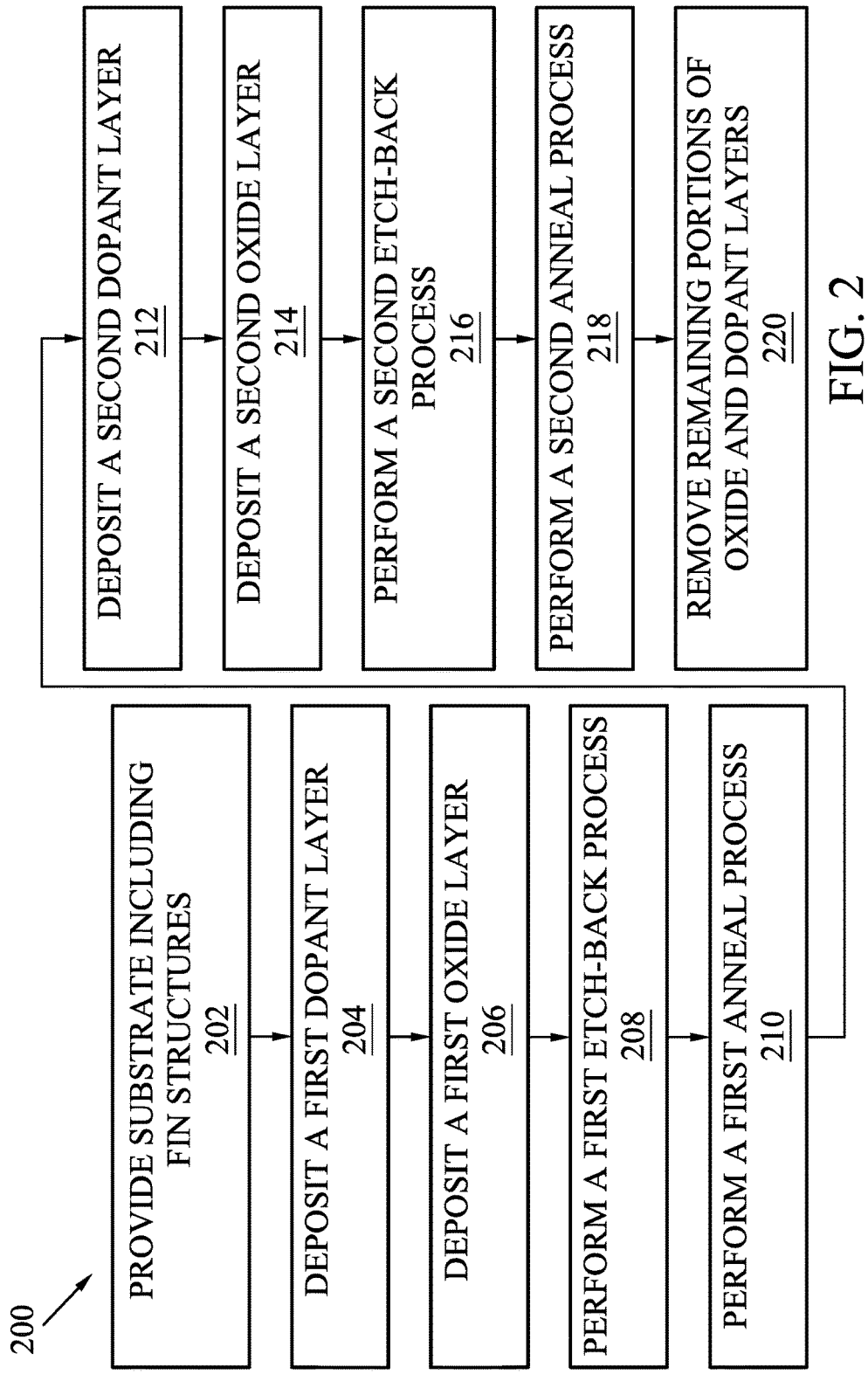
FIG. 2 is a flow chart of a method of forming a fin bottom diode, in accordance with some embodiments.
Figure 6:
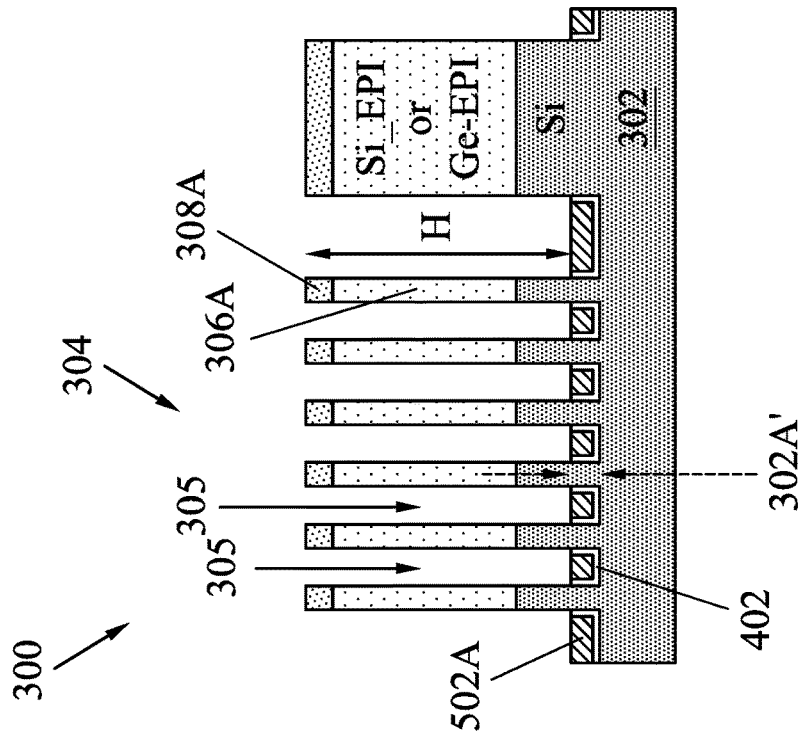
Figure 5:
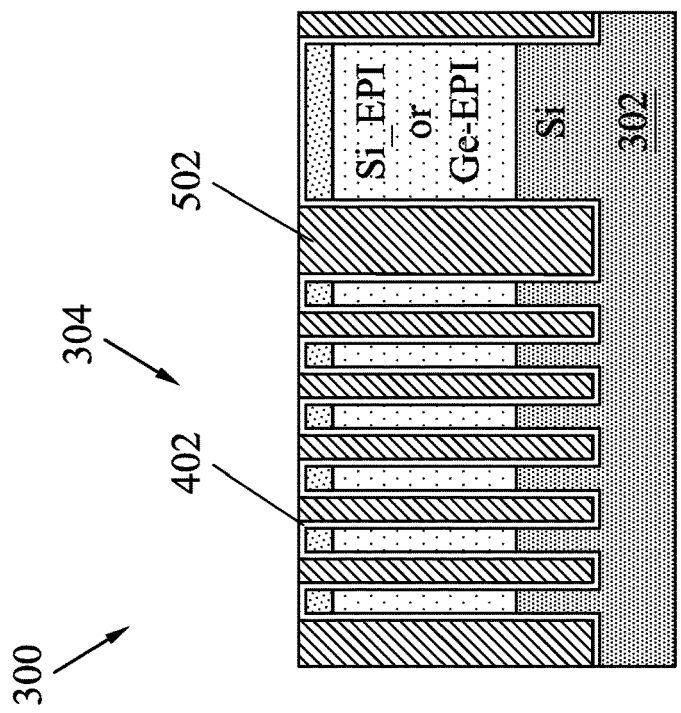
Figure 8:
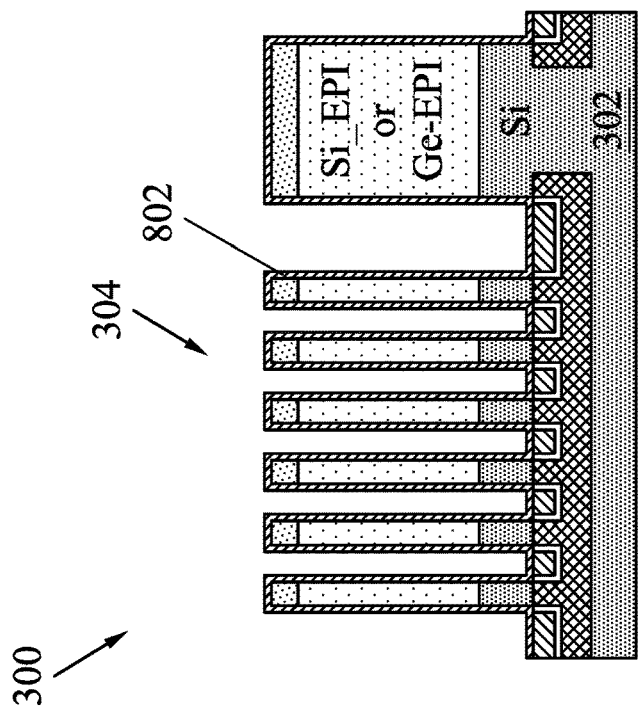

Referring now to FIG. 2, illustrated is a method 200 of forming a fin bottom diode, in accordance with some embodiments. In some embodiments, the method 200 may be used to fabricate a semiconductor device structure 300, described below with reference to FIGS. 3-12. One or more aspects discussed above with reference to the multi-gate device structure 150 of FIG. 1 may also apply to the method 200 and to the device structure 300. Additionally, FIGS. 3-12 provide cross-sectional views of the exemplary semiconductor device structure 300 fabricated according to one or more steps of the method 200 of FIG. 2.

It is understood that parts of the method 200 and/or the device structure 300 may be fabricated by a well-known complementary metal-oxide-semiconductor (CMOS) technology process flow, and thus some processes are only briefly described herein. Further, the device structure 300 may include various other devices and features, such as additional transistors, bipolar junction transistors, resistors, capacitors, diodes, fuses, etc., but is simplified for a better understanding of the inventive concepts of the present disclosure. Further, in some embodiments, the semiconductor device structure 300 includes a plurality of semiconductor devices (e.g., transistors), which may be interconnected.

The device structure 300 may be an intermediate device fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, other memory cells, and/or combinations thereof.

Moreover, it is noted that the process steps of the method 200, including any descriptions given with reference to FIGS. 3-12, are merely exemplary and are not intended to be limiting beyond what is specifically recited in the claims that follow.

The method 200 begins at block 202 where a substrate including fin structures is provided. With reference to FIG. 3, and in an embodiment of block 202, a device structure 300 having a substrate 302 and including fin structures 304 is provided. In some embodiments, the substrate 302 may include a Si substrate. In some cases, the substrate 302 may be substantially the same as the substrate 152 described above with reference to FIG. 1. In some embodiments, the fin structures 304 may be fabricated in a manner substantially similar to the fins 154 described above with reference to FIG. 1. For example, in some embodiments, an epitaxial layer 306 (e.g., such as a Si or Ge epitaxial layer) may be formed over the substrate 302, and a capping layer 308 may be formed over the epitaxial layer 306. Thereafter, using a combination of photolithography and etching processes, the substrate 302, the epitaxial layer 306, and the capping layer 308 may be patterned to form the fin structures 304 and recesses 305 interposing the fin structures 304. By way of example, in various embodiments, each of the fin structures 304 thus includes a substrate portion 302A, an epitaxial layer portion 306A, and a capping layer portion 308A. In various examples, a channel region of the device 300 (e.g., a FinFET channel region) may be formed within the epitaxial layer portion 306A. In some embodiments, the capping layer 308, and thus the capping layer portion 308A, has a thickness of about 100-500 Angstroms. In some cases, the epitaxial layer 306, and thus the epitaxial layer portion 306A, has a thickness of about 300-1000 Angstroms. In various examples, the substrate portion 302A has a thickness of about 1-2 micrometers.

The method 200 then proceeds to block 204 where a first dopant layer is deposited. Referring to the example of FIGS. 3 and 4, in an embodiment of block 204, a dopant layer 402 is deposited over the device 300. In various examples, the dopant layer 402 may include an N-type dopant layer or a P-type dopant layer, for example, depending on the type of device 300 to be fabricated, and depending on the type of fin bottom diode to be fabricated. In some embodiments, the dopant layer 402 may include phospho-silicate glass (PSG), boro-silicate glass (BSG), or boro-phospho-silicate glass (BPSG) that may be deposited by atomic layer deposition (ALD). In some cases, the dopant layer 402 may alternatively be deposited by spin-coating, chemical vapor deposition (CVD), or by another appropriate method. In some embodiments, the dopant layer 402 is deposited conformally over each of the fin structures 304, including conformally on sidewalls of the fin structures 304 within the recesses 305. In some embodiments, the dopant layer 402 may have a thickness of about 5-20 Angstroms.

The method 200 then proceeds to block 206 where a first oxide layer is deposited. Referring to the example of FIGS. 4 and 5, in an embodiment of block 206, an oxide layer 502 is deposited over the device 300. In various examples, the oxide layer 502 may include a low temperature oxide (LTO) deposited over the device 300, including over the dopant layer 402, and within the recesses 305. In some cases, the oxide layer 502 includes a silicon oxide layer ($SiO_2$) or other appropriate LTO. In some embodiments, the oxide layer 502 includes an oxide layer deposited at a temperature less than 300 degrees Celsius. In some examples, the oxide layer 502 includes an oxide layer deposited at a temperature less than 100 degrees Celsius. In various embodiments, solid-phase diffusion of dopants from the dopant layer 402 does not occur during deposition of the oxide layer 502. In some cases, the oxide layer 502 is deposited by an ALD process. Alternatively, in some embodiments, the oxide layer 502 may be deposited by CVD or by another appropriate process. In some examples, after deposition of the oxide layer 502, a chemical mechanical polishing (CMP) process may be performed to remove excess material and planarize a top surface of the device 300. In some embodiments, the CMP process may stop on, and thereby expose, a top surface of the fin structures 304. In various cases, the CMP process may or may not remove the dopant layer 402 from the top surface of the fin structures 304.

The method 200 then proceeds to block 208 where a first etch-back process is performed. Referring to the example of FIGS. 5 and 6, in an embodiment of block 208, an etch-back process is performed to remove a portion of the oxide layer 502 and to expose portions of the sidewalls of the fin structures 304, resulting in recessed oxide layer 502A. In various embodiments, the etch-back process serves to expose lateral surfaces of the capping layer portion 308A, the epitaxial layer portion 306A, and part of the substrate portion 302A, while another part (302A') of the substrate portion 302A remains covered by the dopant layer 402 and the recessed oxide layer 502A. In some embodiments, the etch-back process of block 208 may include a dry etching process, a wet etching process, or a combination thereof. In some examples, a recessing depth is controlled (e.g., by controlling an etching time) so as to result in a desired height H of the exposed portion of the fin structures 304.

Figure 7:
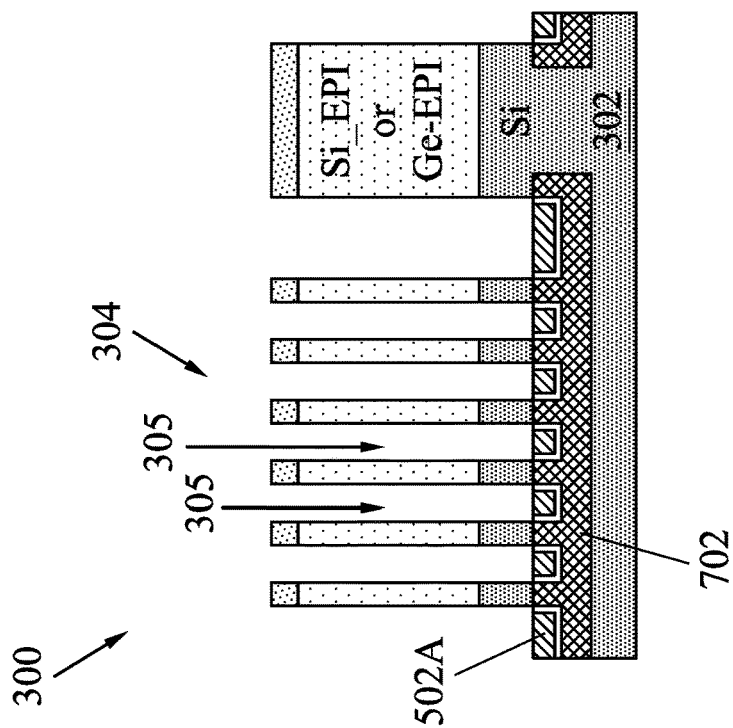
Figure 10:
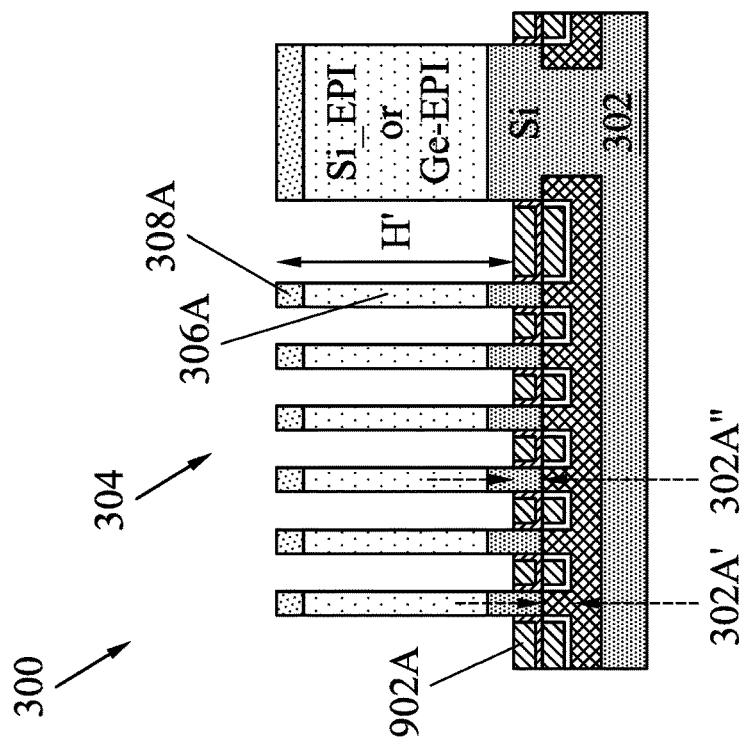
Figure 9:
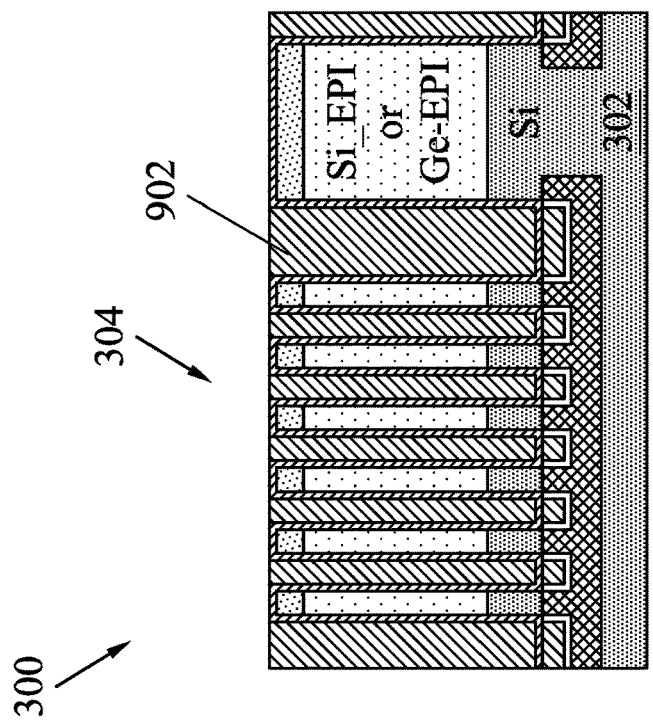

The method 200 then proceeds to block 210 where a first anneal process is performed. Referring to the example of FIGS. 6 and 7, in an embodiment of block 210, a first anneal process may be performed at a temperature between about 450-900° C. In some examples, other anneal temperatures may be used in accordance with various process conditions and/or device requirements, as known in the art. By way of example, the first anneal process provides for solid-phase diffusion of dopants from the dopant layer 402. In some embodiments, and because the dopant layer 402 covers sidewalls of the part 302A' of the substrate portion 302A, as well as a bottom surface of the recesses 305, the first anneal process results in diffusion of dopants from the dopant layer 402 into both the part 302A' of the substrate portion 302A and into a portion of the substrate 302 underlying the dopant layer 402 at the bottom of the recesses 305. Stated another way, the first anneal process results in a doped region 702, as shown in FIG. 7. In various examples, and depending on the material used for the dopant layer 402, the doped region 702 may include an N-type or P-type doped region. In addition, it is noted that the part 302A' of the substrate portion 302A, included within the doped region 702, will form one of the N- or P-type regions of a diode, in accordance with various embodiments. In some embodiments, a dopant concentration of the doped region 702, and thus of the part 302A' of the substrate portion 302A, is greater than about $1 \times 10^{10}$ atoms/cm$^3$ to about $1 \times 10^{20}$ atoms/cm$^3$.

The method 200 then proceeds to block 212 where a second dopant layer is deposited. Referring to the example of FIGS. 7 and 8, in an embodiment of block 212, a dopant layer 802 is deposited over the device 300. In various examples, the dopant layer 802 may include an N-type dopant layer or a P-type dopant layer, for example, depending on the type of device 300 to be fabricated, and depending on the type of fin bottom diode to be fabricated. In some embodiments, the dopant layer 802 may include phospho-silicate glass (PSG), boro-silicate glass (BSG), or boro-phospho-silicate glass (BPSG) that may be deposited by atomic layer deposition (ALD). In some cases, the dopant layer 802 may alternatively be deposited by spin-coating, chemical vapor deposition (CVD), or by another appropriate method. In some embodiments, the dopant layer 802 is deposited conformally over each of the fin structures 304, including conformally on sidewalls of the fin structures 304 within the recesses 305, and on the recessed oxide layer 502A. In some embodiments, the dopant layer 802 may have a thickness of about 5-20 Angstroms.

The method 200 then proceeds to block 214 where a second oxide layer is deposited. Referring to the example of FIGS. 8 and 9, in an embodiment of block 214, an oxide layer 902 is deposited over the device 300. In various examples, the oxide layer 902 may include a low temperature oxide (LTO) deposited over the device 300, including over the dopant layer 802, and within the recesses 305. In some cases, the oxide layer 902 includes a silicon oxide layer (SiO$_2$) or other appropriate LTO. In some embodiments, the oxide layer 902 includes an oxide layer deposited at a temperature less than 300 degrees Celsius. In some examples, the oxide layer 902 includes an oxide layer deposited at a temperature less than 100 degrees Celsius. In various embodiments, solid-phase diffusion of dopants from the dopant layer 802 does not occur during deposition of the oxide layer 902. In some cases, the oxide layer 902 is deposited by an ALD process. Alternatively, in some embodiments, the oxide layer 902 may be deposited by CVD or by another appropriate process. In some examples, after deposition of the oxide layer 902, a chemical mechanical polishing (CMP) process may be performed to remove excess material and planarize a top surface of the device 300.

The method 200 then proceeds to block 216 where a second etch-back process is performed. Referring to the example of FIGS. 9 and 10, in an embodiment of block 216, an etch-back process is performed to remove a portion of the oxide layer 902 and to expose portions of the sidewalls of the fin structures 304, resulting in recessed oxide layer 902A. In various embodiments, the etch-back process serves to expose the capping layer portion 308A, the epitaxial layer portion 306A, and part of the substrate portion 302A, while another part (302A") of the substrate portion 302A remains covered by the dopant layer 802 and the recessed oxide layer 902A. Alternatively, in some embodiments, the second etch-back process may not expose part of the substrate portion 302A. In some embodiments, the etch-back process of block 216 may include a dry etching process, a wet etching process, or a combination thereof. In some examples, a recessing depth is controlled (e.g., by controlling an etching time) so as to result in a desired height H' of the exposed portion of the fin structures 304.

The method 200 then proceeds to block 218 where a second anneal process is performed. Referring to the example of FIGS. 10 and 11, in an embodiment of block 218, a second anneal process may be performed at a temperature between about 450-900° C. In some examples, other anneal temperatures may be used in accordance with various process conditions and/or device requirements, as known in the art. By way of example, the second anneal process provides for solid-phase diffusion of dopants from the dopant layer 802. In some embodiments, and because the dopant layer 802 covers sidewalls of the part 302A" of the substrate portion 302A, the second anneal process results in diffusion of dopants from the dopant layer 802 into the part 302A" of the substrate portion 302A. Stated another way, the second anneal process results in doped regions 1102, as shown in FIG. 11. In various examples, and depending on the material used for the dopant layer 802, the doped regions 1102 may include an N-type or P-type doped regions. In addition, it is noted that the part 302A" of the substrate portion 302A, which are part of the doped regions 1102, will form one of the N- or P-type regions of a diode, in accordance with various embodiments. In some embodiments, a dopant concentration of the doped regions 1102, and thus of the part 302A" of the substrate portion 302A, is greater than about $1 \times 10^{10}$ atoms/cm$^3$ to about $1 \times 10^{20}$ atoms/cm$^3$. Thus, the doped part 302A' of the substrate portion 302A forms one of the N- or P-type regions of a diode, and the doped part 302A" of the substrate portion 302A forms the other of the N- or P-type regions of a diode, effectively forming a P-N diode 1104 at the bottom of each of the fin structures 304.

The method 200 then proceeds to block 220 where remaining portions of oxide and dopant layers are removed. Referring to the example of FIGS. 11 and 12, in an embodiment of block 220, an etching process is performed to remove the recessed oxide layer 902A, the dopant layer 802, the recessed oxide layer 502A, and the dopant layer 402. Thus, the etching process of block 220 exposes the sidewalls of the fin structures 304. In addition, in some embodiments, the etching process of block 220 exposes sidewalls of the P-N diode 1104 at the bottom of each of the fin structures 304, as well as the doped region 702 of the substrate 302 at the bottom of the recesses 305. In various embodiments, the etching process of block 220 may include a dry etching process, a wet etching process, or a combination thereof. In some embodiments, after the etching process of block 220, shallow trench isolation (STI) features may be formed to electrically isolate each of the fin structures 304 from one another.

The semiconductor device 300 may undergo further processing to form various features and regions known in the art. For example, subsequent processing may form gate stacks (e.g., high-K/metal gate stacks), sidewall spacers, source/drain features (e.g., epitaxially grown source/drain features), etch stop layer(s), interlayer dielectric (ILD) layer(s), contact openings, contact metal, as well as various contacts/vias/lines and multilayers interconnect features (e.g., metal layers and interlayer dielectrics) on the substrate 302, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be replaced or eliminated in accordance with various embodiments of the method 200.

Figure 13:
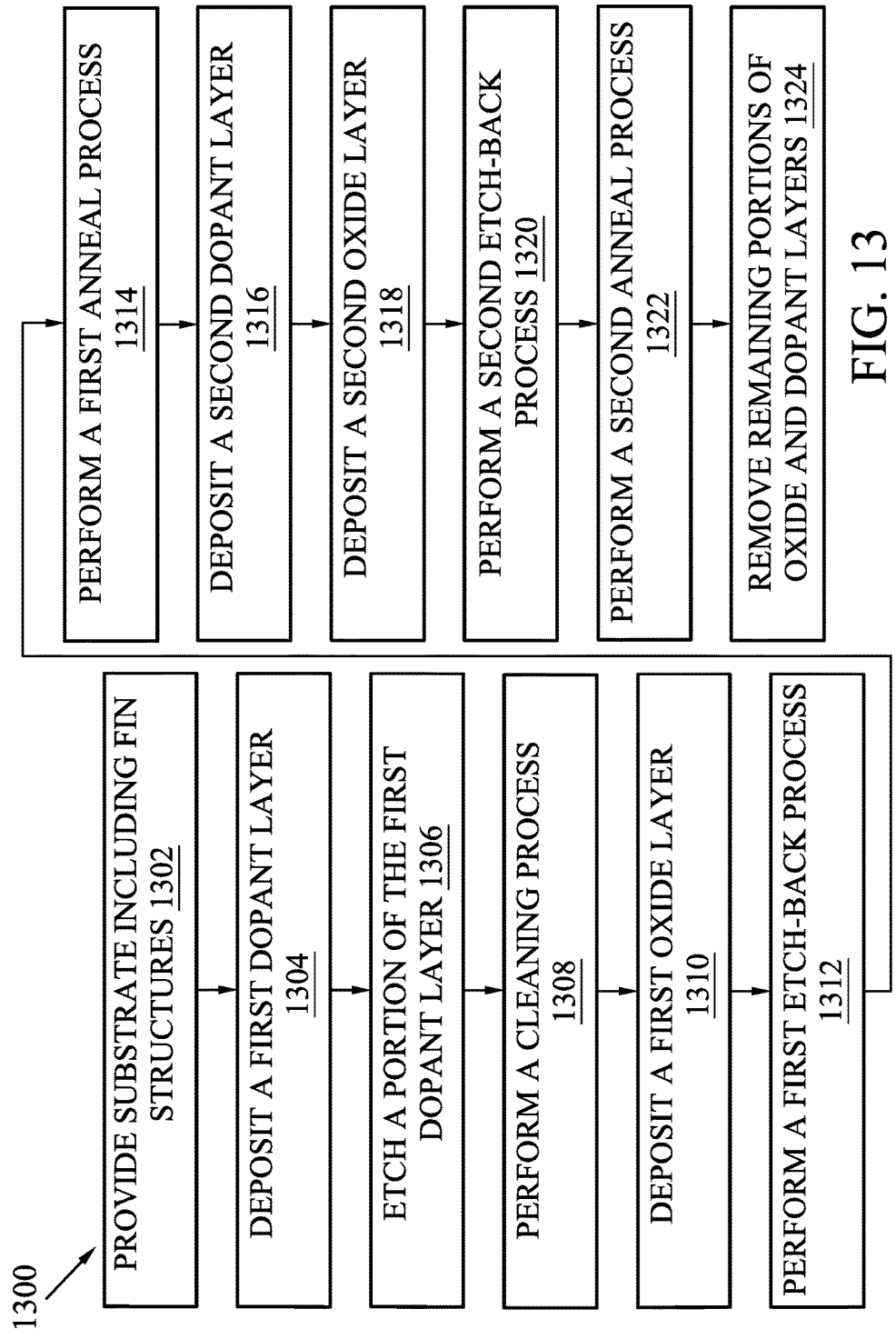
FIG. 13 is a flow chart of an alternative method of forming a fin bottom diode, in accordance with some embodiments.
Figure 17:
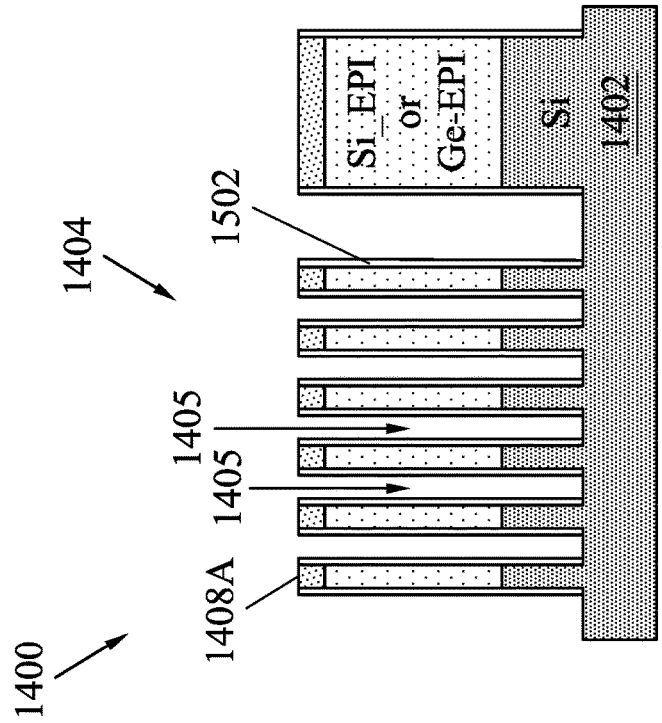
Figure 16:
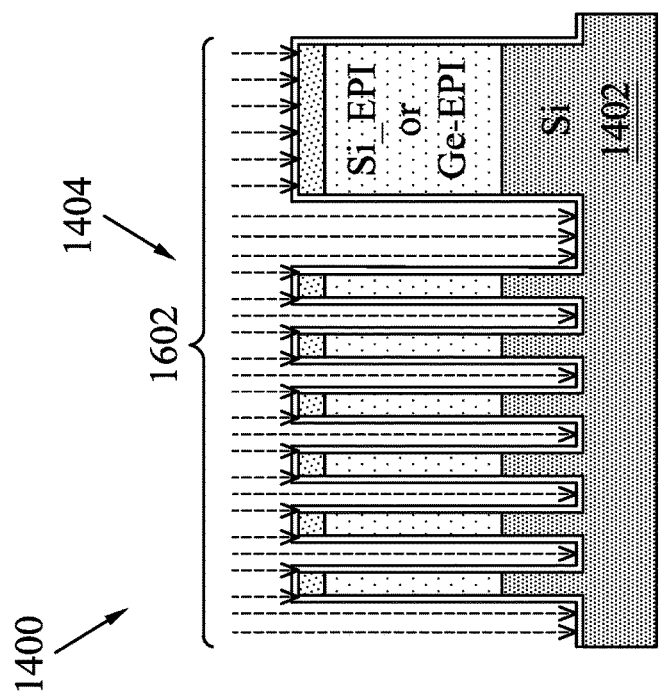
Figure 19:
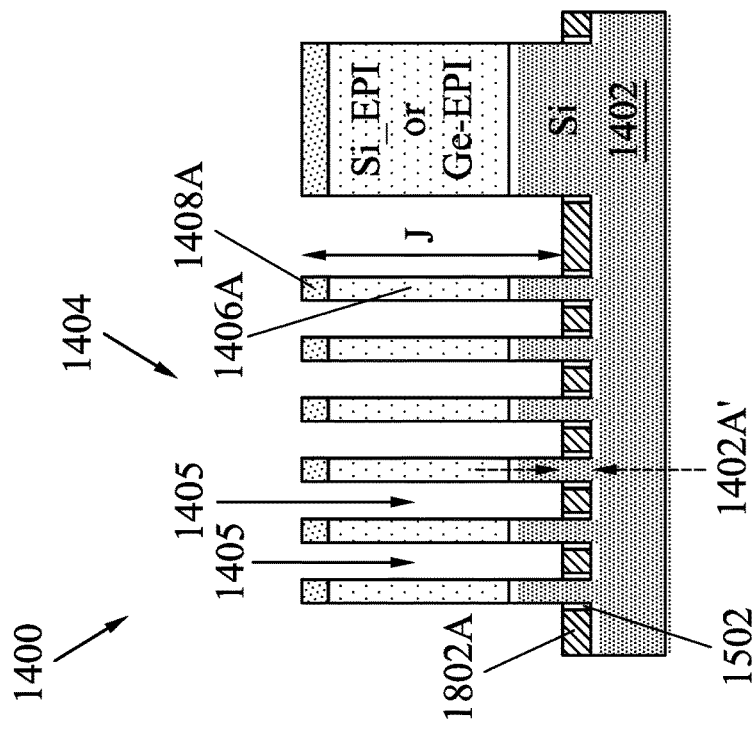
Figure 18:
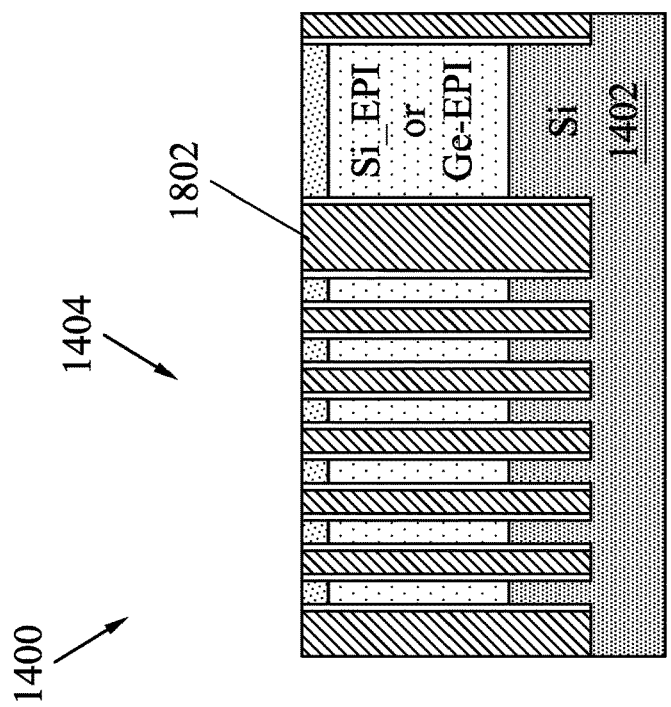

Referring now to FIG. 13, illustrated is an alternative method 1300 of forming a fin bottom diode, in accordance with some embodiments. In some embodiments, the method 1300 may be used to fabricate a semiconductor device structure 1400, described below with reference to FIGS. 14-25. One or more aspects discussed above with reference to the multi-gate device structure 150 of FIG. 1, or with reference to the semiconductor device structure 300 of FIGS. 3-12, may also apply to the method 1300 and to the device structure 1400. Additionally, FIGS. 14-25 provide cross-sectional views of the exemplary semiconductor device structure 1400 fabricated according to one or more steps of the method 1300 of FIG. 13.

It is understood that parts of the method 1300 and/or the device structure 1400 may be fabricated by a well-known complementary metal-oxide-semiconductor (CMOS) technology process flow, and thus some processes are only briefly described herein. In addition, aspects of the method 1300 that are substantially the same as the method 200 may also be only discussed briefly. Further, the device structure 1400 may include various other devices and features, such as additional transistors, bipolar junction transistors, resistors, capacitors, diodes, fuses, etc., but is simplified for a better understanding of the inventive concepts of the present disclosure. Further, in some embodiments, the semiconductor device structure 1400 includes a plurality of semiconductor devices (e.g., transistors), which may be interconnected.

The device structure 1400 may be an intermediate device fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, other memory cells, and/or combinations thereof. Moreover, it is noted that the process steps of the method 1300, including any descriptions given with reference to FIGS. 14-25, are merely exemplary and are not intended to be limiting beyond what is specifically recited in the claims that follow.

The method 1300 begins at block 1302 where a substrate including fin structures is provided. With reference to FIG. 14, and in an embodiment of block 1302, a device structure 1400 having a substrate 1402 and including fin structures 1404 is provided. In some embodiments, the substrate 1402 may include a Si substrate. In some cases, the substrate 1402 may be substantially the same as the substrate 152 described above with reference to FIG. 1. In some embodiments, the fin structures 1404 may be fabricated in a manner substantially similar to the fins 154 described above with reference to FIG. 1. For example, in some embodiments, an epitaxial layer 1406 (e.g., such as a Si or Ge epitaxial layer) may be formed over the substrate 1402, and a capping layer 1408 may be formed over the epitaxial layer 1406. Thereafter, using a combination of photolithography and etching processes, the substrate 1402, the epitaxial layer 1406, and the capping layer 1408 may be patterned to form the fin structures 1404 and recesses 1405 interposing the fin structures 1404. By way of example, in various embodiments, each of the fin structures 1404 thus includes a substrate portion 1402A, an epitaxial layer portion 1406A, and a capping layer portion 1408A. In various examples, a channel region of the device 1400 (e.g., a FinFET channel region) may be formed within the epitaxial layer portion 1406A. In some embodiments, the capping layer 1408, and thus the capping layer portion 1408A, has a thickness of about 100-500 Angstroms. In some cases, the epitaxial layer 1406, and thus the epitaxial layer portion 1406A, has a thickness of about 300-1000 Angstroms. In various examples, the substrate portion 1402A has a thickness of about 1-2 micrometers.

The method 1300 then proceeds to block 1304 where a first dopant layer is deposited. Referring to the example of FIGS. 14 and 15, in an embodiment of block 1304, a dopant layer 1502 is deposited over the device 1400. In various examples, the dopant layer 1502 may include an N-type dopant layer or a P-type dopant layer, for example, depending on the type of device 1400 to be fabricated, and depending on the type of fin bottom diode to be fabricated. In some embodiments, the dopant layer 1502 may include phospho-silicate glass (PSG), boro-silicate glass (BSG), or boro-phospho-silicate glass (BPSG) that may be deposited by atomic layer deposition (ALD). In some cases, the dopant layer 1502 may alternatively be deposited by spin-coating, chemical vapor deposition (CVD), or by another appropriate method. In some embodiments, the dopant layer 1502 is deposited conformally over each of the fin structures 1404, including conformally on sidewalls of the fin structures 1404 within the recesses 1405. In some embodiments, the dopant layer 1502 may have a thickness of about 5-20 Angstroms.

The method 1300 then proceeds to block 1306 where a portion of the first dopant layer is etched. Referring to the example of FIGS. 15 and 16, in an embodiment of block 1306, an etching process 1602 is performed to remove portions of the dopant layer 1502 disposed on top surfaces of each of the fin structures 1404 and on the bottom surface of the recesses 1405, while the dopant layer 1502 remains on sidewalls of the fin structures 1404. In some embodiments, the etching process 1602 includes a dry etching process. Thus, in contrast to the method 200, the method 1300 provides for removal of the dopant layer along the bottom surface of the recesses 1405. As a result, a portion of the substrate 1402 at the bottom of the recesses 1405 will remain substantially undoped, by solid phase diffusion from the dopant layer 1502, during a subsequent anneal process.

The method 1300 then proceeds to block 1308 where a cleaning process is performed. Referring to the example of FIGS. 16 and 17, in an embodiment of block 1308, a cleaning process may be performed to clean exposed surfaces of the device 1400, such as a top surface of the capping layer 1408A, portions of the dopant layer 1502 disposed on sidewalls of the fin structures 1404, and the exposed portion of the substrate 1402 along the bottom surface of the recesses 1405. In some embodiments, the cleaning process of block 1308 may include a wet clean in a standard clean-1 (SC-1) solution, a standard clean-2 (SC-2) solution, a solution of HF, de-ionized (DI) water, a solvent, or other appropriate cleaning solution. In some embodiments, the wet clean solution may include a specified reagent that reacts with the dopant layer 1502. For example, when the dopant layer 1502 includes an ALD-deposited layer, the specified reagent of the wet clean may react with exposed ligands of ALD precursors or decomposed ALD precursors. In at least some embodiments, ALD precursors of PSG, BSG, or BPSG may be etched or cleaned by one or more of the wet clean solutions described above such as the SC-1 solution or the solution of HF.

The method 1300 then proceeds to block 1310 where a first oxide layer is deposited. Referring to the example of FIGS. 17 and 18, in an embodiment of block 1310, an oxide layer 1802 is deposited over the device 1400. In various examples, the oxide layer 1802 may include a low temperature oxide (LTO) deposited over the device 1400 and within the recesses 1405. In some cases, the oxide layer 1802 includes a silicon oxide layer ($SiO_2$) or other appropriate LTO. In some embodiments, the oxide layer 1802 includes an oxide layer deposited at a temperature less than 300 degrees Celsius. In some examples, the oxide layer 1802 includes an oxide layer deposited at a temperature less than 100 degrees Celsius. In various embodiments, solid-phase diffusion of dopants from the dopant layer 1502 does not occur during deposition of the oxide layer 1802. In some cases, the oxide layer 1802 is deposited by an ALD process. Alternatively, in some embodiments, the oxide layer 1802 may be deposited by CVD or by another appropriate process. In some examples, after deposition of the oxide layer 1802, a chemical mechanical polishing (CMP) process may be performed to remove excess material and planarize a top surface of the device 1400. In some embodiments, the CMP process may stop on, and thereby expose, a top surface of the fin structures 304 including a top surface of the capping layer portion 1408A.

The method 1300 then proceeds to block 1312 where a first etch-back process is performed. Referring to the example of FIGS. 18 and 19, in an embodiment of block 1312, an etch-back process is performed to remove a portion of the oxide layer 1802 and to expose portions of the sidewalls of the fin structures 1404, resulting in recessed oxide layer 1802A. In various embodiments, the etch-back process serves to expose lateral surfaces of the capping layer portion 1408A, the epitaxial layer portion 1406A, and part of the substrate portion 1402A, while another part (1402A') of the substrate portion 1402A remains covered by the dopant layer 1502 and the recessed oxide layer 1802A. In some embodiments, the etch-back process of block 1312 may include a dry etching process, a wet etching process, or a combination thereof. In some examples, a recessing depth is controlled (e.g., by controlling an etching time) so as to result in a desired height J of the exposed portion of the fin structures 1404.

Figure 20:
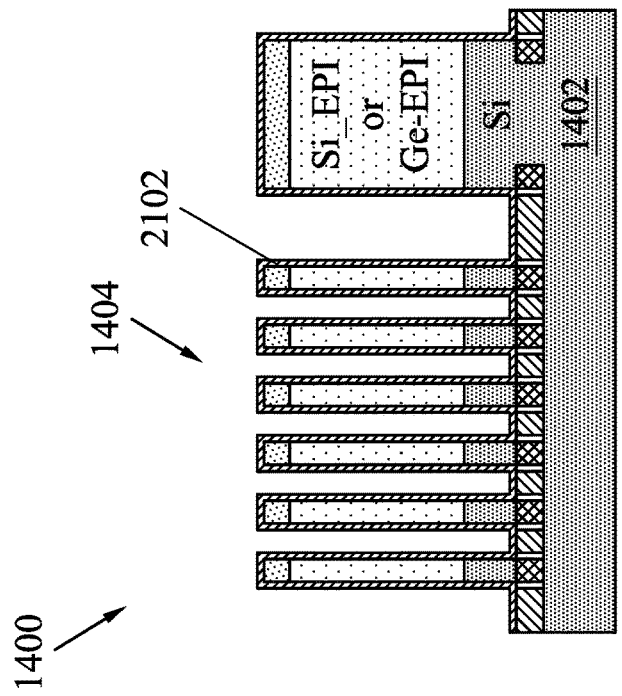
Figure 21:
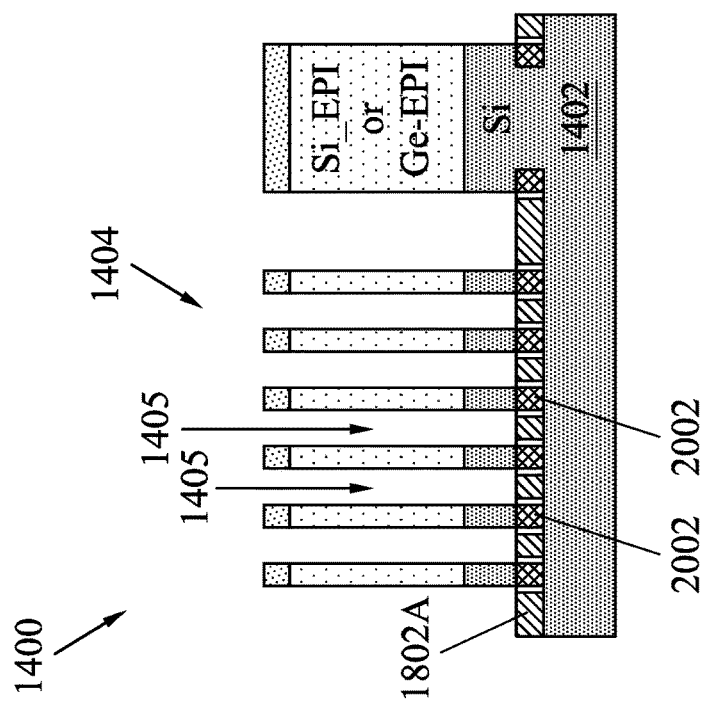
Figures 22, 23:
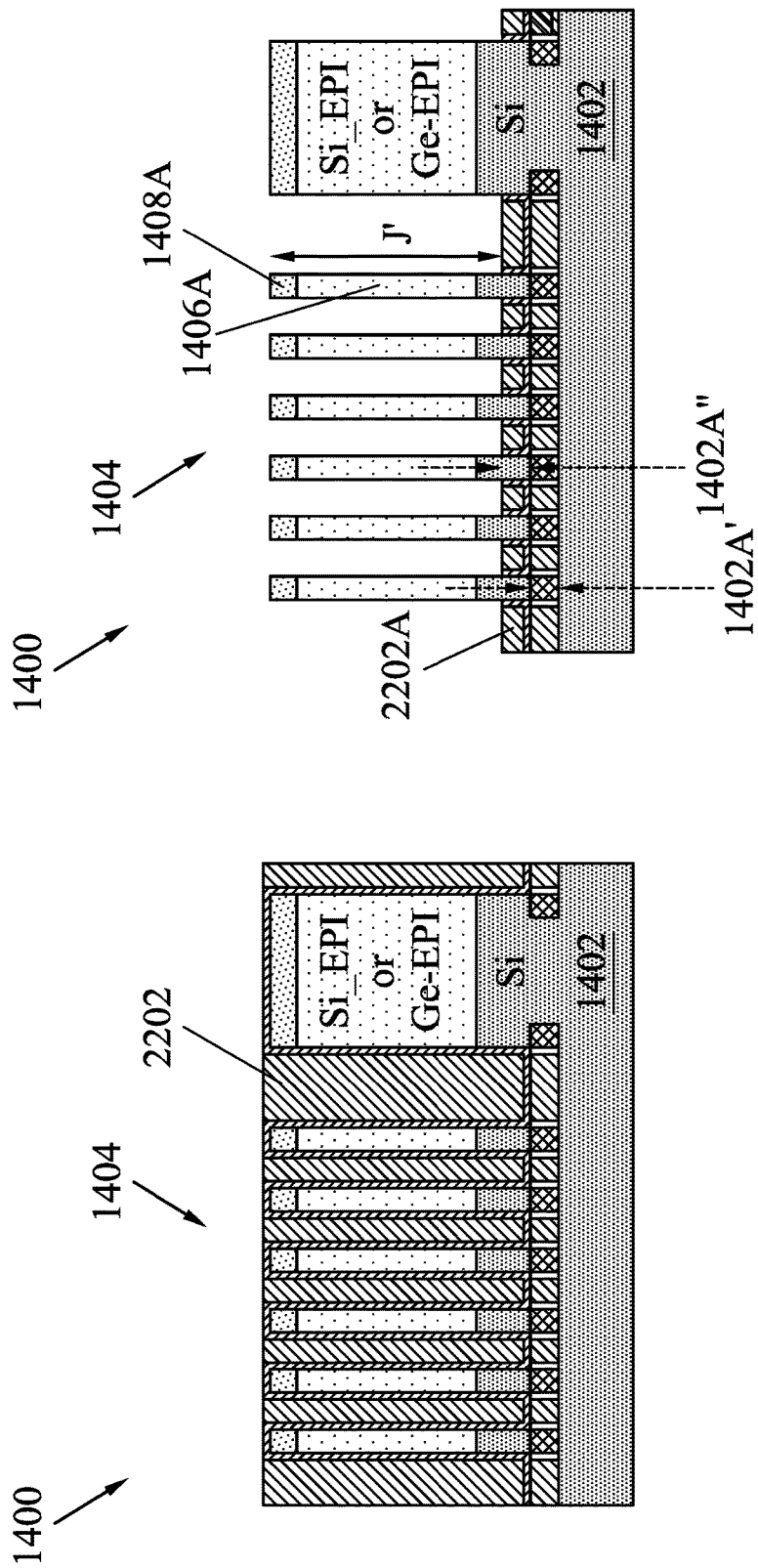

The method 1300 then proceeds to block 1314 where a first anneal process is performed. Referring to the example of FIGS. 19 and 20, in an embodiment of block 1314, a first anneal process may be performed at a temperature between about 450-900° C. By way of example, the first anneal process provides for solid-phase diffusion of dopants from the dopant layer 1502. In some embodiments, and because the dopant layer 1502 covers sidewalls of the part 1402A' of the substrate portion 1402A the first anneal process results in diffusion of dopants from the dopant layer 1502 into the part 1402A' of the substrate portion 1402A, while the portion of the substrate 1402 at the bottom of the recesses 1405 will remain substantially undoped by the solid phase diffusion from the dopant layer 1502. Stated another way, the first anneal process results in doped regions 2002, as shown in FIG. 20. In various examples, and depending on the material used for the dopant layer 1502, the doped regions 2002 may include N-type or P-type doped regions. In addition, it is noted that the part 1402A' of the substrate portion 1402A, which are part of the doped regions 2002, will form one of the N- or P-type regions of a diode, in accordance with various embodiments. In some embodiments, a dopant concentration of the doped regions 2002, and thus of the part 1402A' of the substrate portion 1402A, is greater than about $1 \times 10^{10}$ atoms/$cm^3$ to about $1 \times 10^{20}$ atoms/$cm^3$.

The method 1300 then proceeds to block 1316 where a second dopant layer is deposited. Referring to the example of FIGS. 20 and 21, in an embodiment of block 1316, a dopant layer 2102 is deposited over the device 1400. In various examples, the dopant layer 2102 may include an N-type dopant layer or a P-type dopant layer, for example, depending on the type of device 1400 to be fabricated, and depending on the type of fin bottom diode to be fabricated. In some embodiments, the dopant layer 2102 may include phospho-silicate glass (PSG), boro-silicate glass (BSG), or boro-phospho-silicate glass (BPSG) that may be deposited by atomic layer deposition (ALD). In some cases, the dopant layer 2102 may alternatively be deposited by spin-coating, chemical vapor deposition (CVD), or by another appropriate method. In some embodiments, the dopant layer 2102 is deposited conformally over each of the fin structures 1404, including conformally on sidewalls of the fin structures 1404 within the recesses 1405, and on the recessed oxide layer 1802A. In some embodiments, the dopant layer 2102 may have a thickness of about 5-20 Angstroms.

The method 1300 then proceeds to block 1318 where a second oxide layer is deposited. Referring to the example of FIGS. 21 and 22, in an embodiment of block 1318, an oxide layer 2202 is deposited over the device 1400. In various examples, the oxide layer 2202 may include a low temperature oxide (LTO) deposited over the device 1400, including over the dopant layer 2102, and within the recesses 1405. In some cases, the oxide layer 2202 includes a silicon oxide layer ($SiO_2$) or other appropriate LTO. In some embodiments, the oxide layer 2202 includes an oxide layer deposited at a temperature less than 300 degrees Celsius. In some examples, the oxide layer 2202 includes an oxide layer deposited at a temperature less than 100 degrees Celsius. In various embodiments, solid-phase diffusion of dopants from the dopant layer 2102 does not occur during deposition of the oxide layer 2202. In some cases, the oxide layer 2202 is deposited by an ALD process. Alternatively, in some embodiments, the oxide layer 2202 may be deposited by CVD or by another appropriate process. In some examples, after deposition of the oxide layer 2202, a chemical mechanical polishing (CMP) process may be performed to remove excess material and planarize a top surface of the device 1400.

The method 1300 then proceeds to block 1320 where a second etch-back process is performed. Referring to the example of FIGS. 22 and 23, in an embodiment of block 1320, an etch-back process is performed to remove a portion of the oxide layer 2202 and to expose portions of the sidewalls of the fin structures 1404, resulting in recessed oxide layer 2202A. In various embodiments, the etch-back process serves to expose the capping layer portion 1408A, the epitaxial layer portion 1406A, and part of the substrate portion 1402A, while another part (1402A") of the substrate portion 1402A remains covered by the dopant layer 2102 and the recessed oxide layer 2202A. Alternatively, in some embodiments, the second etch-back process may not expose part of the substrate portion 1402A. In some embodiments, the etch-back process of block 1320 may include a dry etching process, a wet etching process, or a combination thereof. In some examples, a recessing depth is controlled (e.g., by controlling an etching time) so as to result in a desired height J' of the exposed portion of the fin structures 1404.

Figures 24, 25:
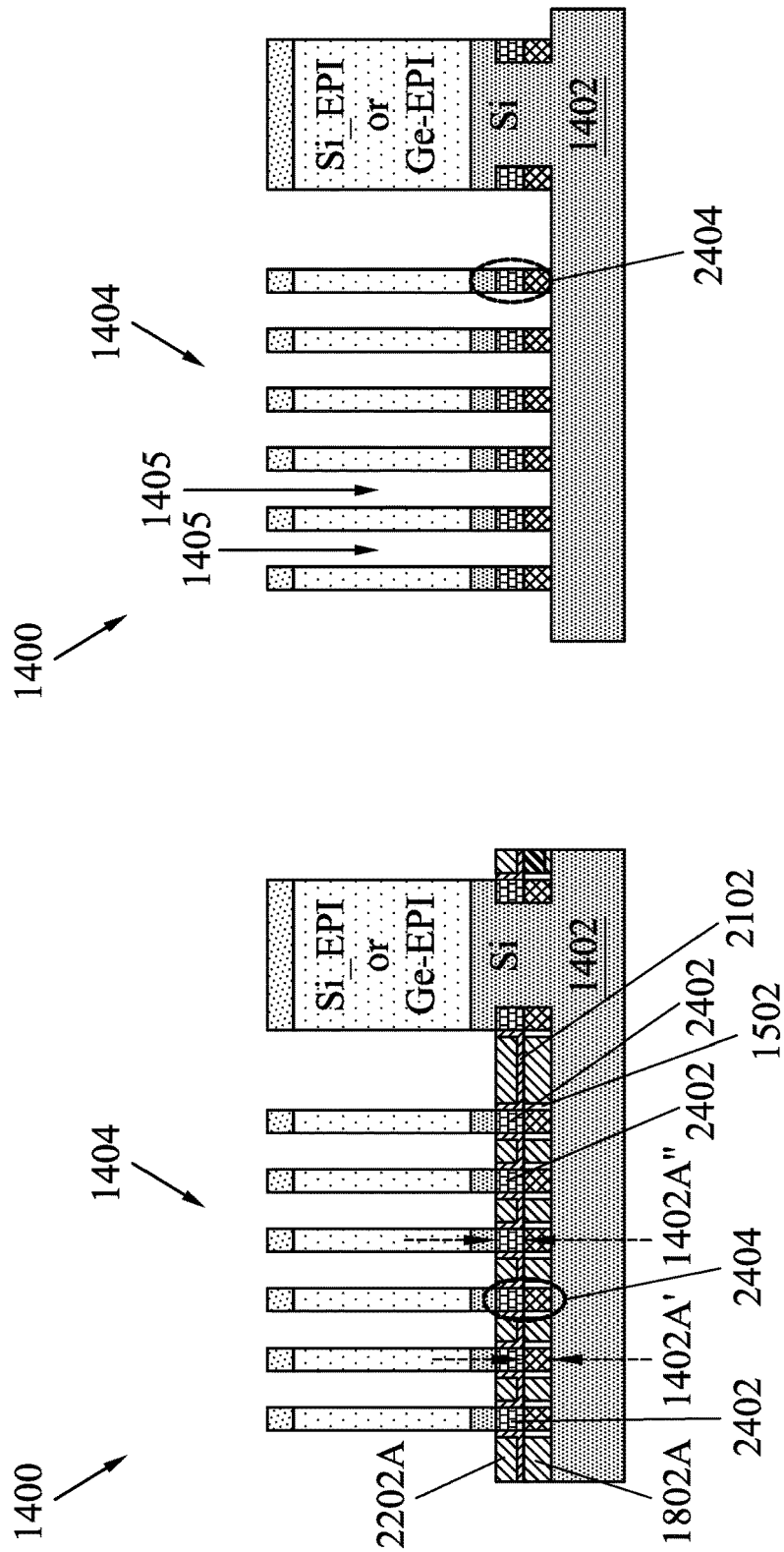

The method 1300 then proceeds to block 1322 where a second anneal process is performed. Referring to the example of FIGS. 23 and 24, in an embodiment of block 1322, a second anneal process may be performed at a temperature between about 450-900° C. By way of example, the second anneal process provides for solid-phase diffusion of dopants from the dopant layer 2102. In some embodiments, and because the dopant layer 2102 covers sidewalls of the part 1402A" of the substrate portion 1402A, the second anneal process results in diffusion of dopants from the dopant layer 2102 into the part 1402A" of the substrate portion 1402A. Stated another way, the second anneal process results in doped regions 2402, as shown in FIG. 24. In various examples, and depending on the material used for the dopant layer 2102, the doped regions 2402 may include an N-type or P-type doped regions. In addition, it is noted that the part 1402A" of the substrate portion 1402A, which are part of the doped regions 2402, will form one of the N- or P-type regions of a diode, in accordance with various embodiments. In some embodiments, a dopant concentration of the doped regions 2402, and thus of the part 1402A" of the substrate portion 1402A, is greater than about $1 \times 10^{10}$ atoms/cm$^3$ to about $1 \times 10^{20}$ atoms/cm$^3$. Thus, the doped part 1402A' of the substrate portion 1402A forms one of the N- or P-type regions of a diode, and the doped part 1402A" of the substrate portion 1402A forms the other of the N- or P-type regions of a diode, effectively forming a P-N diode 2404 at the bottom of each of the fin structures 1404.

The method 1300 then proceeds to block 1324 where remaining portions of oxide and dopant layers are removed. Referring to the example of FIGS. 24 and 25, in an embodiment of block 1324, an etching process is performed to remove the recessed oxide layer 2202A, the dopant layer 2102, the recessed oxide layer 1802A, and the dopant layer 1502. Thus, the etching process of block 1324 exposes the sidewalls of the fin structures 1404. In addition, in some embodiments, the etching process of block 1324 exposes sidewalls of the P-N diode 2404 at the bottom of each of the fin structures 1404, as well as the portion of the substrate 1402 at the bottom of the recesses 1405. In various embodiments, the etching process of block 1324 may include a dry etching process, a wet etching process, or a combination thereof. In some embodiments, after the etching process of block 1324, shallow trench isolation (STI) features may be formed to electrically isolate each of the fin structures 1404 from one another.

The semiconductor device 1400 may undergo further processing to form various features and regions known in the art. For example, subsequent processing may form gate stacks (e.g., high-K/metal gate stacks), sidewall spacers, source/drain features (e.g., epitaxially grown source/drain features), etch stop layer(s), interlayer dielectric (ILD) layer(s), contact openings, contact metal, as well as various contacts/vias/lines and multilayers interconnect features (e.g., metal layers and interlayer dielectrics) on the substrate 1402, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 1300, and some process steps described above may be replaced or eliminated in accordance with various embodiments of the method 1300.

The various embodiments described herein offer several advantages over the existing art. It will be understood that not all advantages have been necessarily discussed herein, no particular advantage is required for all embodiments, and other embodiments may offer different advantages. As one example, embodiments discussed herein include methods and structures directed to forming a fin bottom diode for a multi-gate device (e.g., FinFET device) and related structures. In at least some embodiments, a diode structure is formed at the bottom of an individual fin structure to effectively lower leakage current for the FinFET device fabricated using the individual fin structure. In addition, and in contrast to some existing processes, the fin bottom diodes disclosed herein may be formed without the use of ion implantation processes (e.g., a Si substrate pre-implant process), thereby avoiding the problems associated with ion implantation processes. In various examples, the fin bottom diodes disclosed herein may also be designed and/or adjusted as needed for each fin of a plurality of fins disposed on a substrate. Thus, the various embodiments disclosed herein provide for more robust FinFET devices that are designed to mitigate at least some of the issues associated with aggressive scaling of IC devices.

Thus, one of the embodiments of the present disclosure described a method for fabricating a semiconductor device including providing a substrate having a plurality of fins extending from the substrate, where each of the plurality of fins includes a substrate portion and an epitaxial layer portion over the substrate portion. In some embodiments, a first dopant layer is formed on sidewalls of a first region of the substrate portion of each of the plurality of fins. In some cases, and after forming the first dopant layer, a first annealing process is performed to form a first diode region within the first region of the substrate portion of each of the plurality of fins. In some embodiments, a second dopant layer is formed on sidewalls of a second region of the substrate portion of each of the plurality of fins. In some examples, and after forming the second dopant layer, a second annealing process is performed to form a second diode region within the second region of the substrate portion of each of the plurality of fins.

In another of the embodiments, discussed is a method where a substrate having a first fin structure, a second fin structure, and a recess interposing the first and second fin structures is provided. In some cases, each of the first and second fin structures includes a first region and a second region formed over the first region. In various examples, a first dopant layer is conformally formed over each of the first fin structure, the second fin structure, and on a bottom surface of the recess interposing the first and second fin structures. In some examples, and after forming the first dopant layer, a first oxide layer is formed within the recess and a first etch-back process is performed to expose sidewalls of both the second region of the first and second fin structures and a first portion of the first region of the first and second fin structures, where the first dopant layer remains on sidewalls of a second portion of the first region of the first and second fin structures. In some embodiments, and after performing the first etch-back process, a first annealing process is performed to diffuse a first dopant species from the first dopant layer into the second portion of the first region, where the second portion of the first region defines a first diode region.

In yet another of the embodiments, discussed is a semiconductor device including a substrate having a first fin and a second fin extending from the substrate, where each of the first and second fins includes a substrate portion and an epitaxial layer portion over the substrate portion. In some cases, the semiconductor device further includes a recess interposing the first and second fins, and a P-N diode formed within the substrate portion of each of the first and second fins. In some embodiments, the P-N diode includes a first dopant species in a first region of the substrate portion of each of the first and second fins, the P-N diode includes a second dopant species in a second region of the substrate portion of each of the first and second fins, and the first and second regions of the substrate portion are adjacent to each other. In some examples, a portion of the substrate disposed below a bottom surface of the recess remains substantially undoped by the first and second dopant species.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
   providing a substrate having a plurality of fins extending from the substrate, wherein each of the plurality of fins includes a substrate portion and an epitaxial layer portion over the substrate portion;
   forming a first dopant layer on sidewalls of a first region of the substrate portion of each of the plurality of fins;
   after forming the first dopant layer, performing a first annealing process to form a first diode region within the first region of the substrate portion of each of the plurality of fins;
   forming a second dopant layer on sidewalls of a second region of the substrate portion of each of the plurality of fins; and
   after forming the second dopant layer, performing a second annealing process to form a second diode region within the second region of the substrate portion of each of the plurality of fins.

2. The method of claim 1, wherein each of the plurality of fins includes the substrate portion, the epitaxial layer portion over the substrate portion, and a capping layer portion over the epitaxial layer portion.

3. The method of claim 1, further comprising:
   forming the first dopant layer on sidewalls of the first region of the substrate portion of each of the plurality of fins and on bottom surfaces of recesses interposing the plurality of fins.

4. The method of claim 1, further comprising:
   prior to forming the second dopant layer, forming an oxide layer within recesses interposing the plurality of fins, wherein the oxide layer is disposed over the first dopant layer.

5. The method of claim 4, further comprising:
   after forming the oxide layer, etching the oxide layer within the recesses to expose lateral surfaces of both the epitaxial layer portion and the second region of the substrate portion of each of the plurality of fins; and
   after etching the oxide layer, forming the second dopant layer on the exposed lateral surfaces of the second region of the substrate portion of each of the plurality of fins.

6. The method of claim 1, further comprising:
   prior to performing the second annealing process, forming an oxide layer within recesses interposing the plurality of fins, wherein the oxide layer is disposed over the second dopant layer.

7. The method of claim 6, further comprising:
   after forming the oxide layer, etching the oxide layer within the recesses to expose lateral surfaces of both the epitaxial layer portion and a third region of the substrate portion of each of the plurality of fins; and
   after etching the oxide layer, performing the second annealing process to form the second diode region.

8. The method of claim 1, wherein the first dopant layer and the second dopant layer include phospho-silicate glass (PSG), boro-silicate glass (BSG), or boro-phospho-silicate glass (BPSG).

9. The method of claim 8, wherein the first dopant layer and the second dopant layer are deposited by atomic layer deposition (ALD).

10. The method of claim 1, wherein the first diode region is formed by diffusion of a first dopant species from the first dopant layer into the first region of the substrate portion of each of the plurality of fins, and wherein the second diode region is formed by diffusion of a second dopant species from the second dopant layer into the second region of the substrate portion of each of the plurality of fins.

11. The method of claim 10, wherein the epitaxial layer portion of each of the plurality of fins includes a FinFET channel region.

12. A method of fabricating a semiconductor device, comprising:
providing a substrate having a first fin structure, a second fin structure, and a recess interposing the first and second fin structures, wherein each of the first and second fin structures includes a first region and a second region formed over the first region;
forming a first dopant layer conformally over each of the first fin structure, the second fin structure, and on a bottom surface of the recess interposing the first and second fin structures;
after forming the first dopant layer, forming a first oxide layer within the recess and performing a first etch-back process to expose sidewalls of both the second region of the first and second fin structures and a first portion of the first region of the first and second fin structures, wherein the first dopant layer remains on sidewalls of a second portion of the first region of the first and second fin structures; and
after performing the first etch-back process, performing a first annealing process to diffuse a first dopant species from the first dopant layer into the second portion of the first region, wherein the second portion of the first region defines a first diode region.

13. The method of claim 12, further comprising:
prior to forming the first oxide layer, removing the first dopant layer from top surfaces of each of the first and second fin structures and from the bottom surface of the recess; and
after removing the first dopant layer from the top surfaces and from the bottom surface, forming the first oxide layer within the recess.

14. The method of claim 12, further comprising:
after performing the first annealing process, forming a second dopant layer conformally over each of the first and second fin structures; and
after forming the second dopant layer, forming a second oxide layer within the recess and performing a second etch-back process to expose sidewalls of both the second region of the first and second fin structures and a third portion of the first region of the first and second fin structures, wherein the second dopant layer remains on sidewalls of the first portion of the first region of the first and second fin structures; and
after performing the second etch-back process, performing a second annealing process to diffuse a second dopant species from the second dopant layer into the first portion of the first region, wherein the first portion of the first region defines a second diode region.

15. The method of claim 13, further comprising:
after removing the first dopant layer from the top surfaces and from the bottom surface, and prior to forming the first oxide layer within the recess, cleaning exposed surfaces of the semiconductor device.

16. The method of claim 14, further comprising:
after performing the second annealing process, removing remaining portions of the first dopant layer, the second dopant layer, the first oxide layer, and the second oxide layer.

17. The method of claim 14, wherein the first dopant layer and the second dopant layer include atomic layer deposition (ALD)-deposited phospho-silicate glass (PSG), boro-silicate glass (BSG), or boro-phospho-silicate glass (BPSG).

18. The method of claim 14, wherein the first and second annealing processes are performed at a temperature between about 450-900° C.

19. A method, comprising:
etching a multi-layer substrate to form a multi-layer fin structure and a recess adjacent to the multi-layer fin structure;
forming a first P-N diode region within a first layer of the multi-layer fin structure, wherein the first P-N diode region include a first dopant species; and
forming a second P-N diode region within the first layer of the multi-layer fin structure, wherein the second P-N diode region is adjacent to the first P-N diode region, and wherein the second P-N diode region includes a second dopant species different than the first dopant species;
wherein after the forming the first and second P-N diode regions, a bottom surface of the recess adjacent to the multi-fin structure remains substantially undoped by the first and second dopant species.

20. The method of claim 19, wherein the forming the first P-N diode region within a first layer of the multi-layer fin structure includes diffusing the first dopant species from a first dopant layer into the first P-N diode region, and wherein the forming the second P-N diode region within the first layer of the multi-layer fin structure includes diffusing the second dopant species from a second dopant layer into the second P-N diode region.

* * * * *